(12) United States Patent
Seff et al.

(10) Patent No.: US 9,958,491 B2
(45) Date of Patent: May 1, 2018

(54) GROUND FAULT MONITORING SYSTEM

(71) Applicant: EATON CORPORATION, Cleveland, OH (US)

(72) Inventors: Paul David Seff, Williamsburg, VA (US); Christopher Emmons Drueke, Williamsburg, VA (US); Jason Demetrios Easton, Williamsburg, VA (US); Tyler Devon Young, Yorktown, VA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days. days.

(21) Appl. No.: 15/631,335

(22) Filed: Jun. 23, 2017

(65) Prior Publication Data
US 2017/0285089 A1 Oct. 5, 2017

Related U.S. Application Data

(62) Division of application No. 14/658,800, filed on Mar. 16, 2015, now abandoned.

(51) Int. Cl.
*G01R 31/14* (2006.01)
*G01R 31/02* (2006.01)
*G01R 31/08* (2006.01)
*G01R 27/18* (2006.01)

(52) U.S. Cl.
CPC .......... *G01R 31/025* (2013.01); *G01R 27/18* (2013.01); *G01R 31/086* (2013.01)

(58) Field of Classification Search
CPC .... G01R 31/035; G01R 31/025; G01R 31/08; G01R 31/086; G01R 31/021; G01R 31/026; G01R 31/083; G01R 31/088; G01R 31/28; G01R 31/2806; G01R 31/315; G01R 31/1272; G01R 29/18; G01R 27/18; G01R 324/509; G01R 324/531; G01R 324/536; G01R 324/555; G01R 361/42–361/50; H02H 1/0015
See application file for complete search history.

(56) References Cited

U.S. PATENT DOCUMENTS

| | | | |
|---|---|---|---|
| 8,204,709 B2 * | 6/2012 | Presher, Jr. | H02J 7/35 702/88 |
| 9,488,689 B2 | 11/2016 | Dougherty | |
| 2009/0248329 A1 | 10/2009 | Restrepo | |
| 2010/0060468 A1 * | 3/2010 | Elms | G01R 31/3272 340/638 |

(Continued)

*Primary Examiner* — Thang Le
(74) *Attorney, Agent, or Firm* — Eckert Seamans

(57) ABSTRACT

A ground fault monitoring system includes a ground fault interface device including a power interface and a data interface. The ground fault interface device is structured to output power via the power interface and to receive data via the data interface. The ground fault monitoring system also includes a plurality of ground fault devices structured to detect a ground fault on an associated circuit, to output data of the detected ground fault to the ground fault interface device, and to receive power to operate the ground fault devices via power lines. The plurality of ground fault devices are electrically connected in a series connection with the ground fault interface device by data lines and power lines. Each of the ground fault devices is configured to pass through received data and power.

7 Claims, 2 Drawing Sheets

(56) References Cited

U.S. PATENT DOCUMENTS

| | | | |
|---|---|---|---|
| 2010/0085670 A1* | 4/2010 | Palaniswami | H02H 7/20 |
| | | | 361/42 |
| 2011/0025341 A1* | 2/2011 | Lupaczyk | G01R 31/025 |
| | | | 324/509 |
| 2011/0098951 A1* | 4/2011 | Jurisch | H02H 3/305 |
| | | | 702/58 |
| 2012/0072041 A1* | 3/2012 | Miller | F24J 2/38 |
| | | | 700/292 |
| 2013/0054183 A1 | 2/2013 | Afzal et al. | |
| 2013/0271298 A1 | 10/2013 | Restrepo et al. | |
| 2014/0091807 A1* | 4/2014 | Lontka | G01R 31/025 |
| | | | 324/509 |
| 2015/0168487 A1 | 6/2015 | Parker et al. | |
| 2015/0280642 A1* | 10/2015 | Chisenga | H02S 50/10 |
| | | | 136/244 |
| 2016/0041216 A1 | 2/2016 | Tang et al. | |

\* cited by examiner

GROUND FAULT MONITORING SYSTEM

CROSS-REFERENCE TO RELATED APPLICATION

This application is a division of application Ser. No. 14/658,800, filed Mar. 16, 2015, and entitled "GROUND FAULT MONITORING SYSTEM" the contents of which are incorporated herein by reference.

BACKGROUND

Field

The disclosed concept pertains generally to ground fault monitoring systems, and, more particularly, to ground fault monitoring systems including multiple ground fault devices.

Background Information

Ground faults in circuits occur when electricity flowing through the circuit travels to ground outside an intended grounding path. Ground faults are typically detected by using a pair of current sensors (e.g., without limitation, current transformers) to determine whether current flowing through line and neutral conductors is equal. Unequal current flowing through the line and neutral conductors can indicate that there is a ground fault in the circuit.

Ground faults in the circuit can be hazardous, and thus it is important that they are detected. In applications where multiple circuits must be monitored for ground fault such as, without limitation, marina power systems, it is beneficial to ascertain the status of all of the circuits from a central location.

One type of existing ground fault monitoring system includes a ground fault monitor and multiple associated ground fault relays, an example of which is shown in FIG. 1.

As shown in FIG. 1, the system includes a ground fault monitor 2 and multiple ground fault relays 12. The ground fault relays 12 are each configured to electrically connect to associated current transformers 14. The current transformers 14 are used to sense current flowing through the circuits. Based on the inputs of the current transformers 14, the ground fault relays 12 can detect ground faults in the circuits. The ground fault relays 12 relay information about any ground faults in the circuits back to the ground fault monitor 2 where a user of the system can access the information.

The ground fault monitor 2 includes multiple input connectors 4, 6, 8, 10. Each input connector 4, 6, 8, 10 is configured to allow a connection to one associated ground fault relay 12. As shown in FIG. 1, three of the input connectors 4, 6, 8 are used to electrically connect the ground fault monitor 2 to the three associated ground fault relays 12. One of the input connectors 10 is not electrically connected to an associated ground fault relay 12. The system of FIG. 1 is able to accommodate one additional ground fault relay 12 electrically connected to the ground fault monitor 2 for a maximum of four ground fault relays 12. Thus, the number of ground fault relays 12 that may be electrically connected to the ground fault monitor 2 is limited by the number of input connectors 4, 6, 8, 10 that are included in the ground fault monitor 2.

Using the ground fault monitor 2 with the fixed number of input connectors 4, 6, 8, 10 can be inefficient. For example, the number of ground fault relays 12 that are needed in an application may be known when selecting the ground fault monitor 2 with four input connectors 4, 6, 8, 10. However, over time, the number of ground fault relays 12 that are needed in the application may grow. If the ground fault monitor 2 does not include enough input connectors 4, 6, 8, 10 for the newly needed ground fault relays 12, a ground fault monitor with more input connectors or a second ground fault monitor would be needed. Additionally, initially selecting the ground fault monitor 2 with additional unused input connectors 4, 6, 8, 10, which is likely more complex and expensive than a ground fault monitor with a smaller number of input connectors, requires speculation into the potential expansion of the number of ground fault relays 12 that are needed. In the case that the number of ground fault relays 12 that are needed does not expand as much as expected, a ground fault monitor with a smaller number of input connectors could have initially been selected to save cost. Moreover, in the case that the number of ground fault relays 12 that are needed expands more than expected, a ground fault monitor with more input connectors or a second ground fault monitor would still need to be acquired despite planning for the anticipated expansion of the application, thus increasing the cost of the system.

There is therefore room for improvement in ground fault monitoring systems.

SUMMARY

These needs and others are met by embodiments of the disclosed concept, which are directed to a ground fault monitoring system in which the number of ground fault devices associated with a ground fault interface device may be expanded without the need for additional input interfaces in the ground fault interface device.

In accordance with one aspect of the disclosed concept a ground fault monitoring system comprises: a plurality of data lines; a plurality of power lines; a ground fault interface device including a power interface structured to connect to one of the power lines and a data interface structured to connect to one of the data lines, wherein the ground fault interface device is structured to output power via the power interface and to receive data via the data interface; a plurality of ground fault devices structured to detect a ground fault on an associated circuit, to output data of the detected ground fault to the ground fault interface device via the data lines, and to receive power to operate the ground fault devices via the power lines, wherein the plurality of ground fault devices are electrically connected in a series connection with the ground fault interface device by the plurality of data lines and the plurality of power lines, wherein each of the plurality of ground fault devices is configured to pass through data received via the data lines to a previous one of the plurality of ground fault devices in the series connection if the ground fault device is not first in the series connection and to pass through data received via the data lines to the ground fault interface device if the ground fault device is first in the series connection, and wherein each of the plurality of ground fault devices is configured to pass through power received via the power lines to a next one of the plurality of ground fault devices in the series connection.

In accordance with another aspect of the disclosed concept a ground fault monitoring system comprises: a plurality of power lines; a ground fault interface device including a power interface structured to connect to one of the power lines and a wireless receiver structured to receive wirelessly transmitted data, wherein the ground fault interface device is structured to output power via the power interface; a plurality of ground fault devices structured to detect a ground fault on an associated circuit and to receive power to operate the ground fault devices via the power lines, wherein each of the plurality of ground fault devices includes a wireless transmitter structured to output the data of the detected ground fault to the wireless transmitter included in the ground fault interface device, wherein the plurality of ground fault devices are electrically connected in a series connection with the ground fault interface device by the plurality of power lines, and wherein each of the plurality of ground fault devices is configured to pass through power received via the power lines to a next one of the plurality of ground fault devices in the series connection.

In accordance with a further aspect of the disclosed concept a ground fault monitoring system comprises: a ground fault interface device including a wireless receiver structured to receive wirelessly transmitted data; a plurality of ground fault devices structured to detect a ground fault on an associated circuit, wherein each of the plurality of ground fault devices includes a wireless transmitter structured to output the data of the detected ground fault to the wireless transmitter included in the ground fault interface device, wherein each of the plurality of ground fault devices includes a power input interface structured to electrically connect to and receive power from a corresponding power source, and wherein each of the plurality of ground fault devices is structured to use power received via the power interface to operate the ground fault device.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
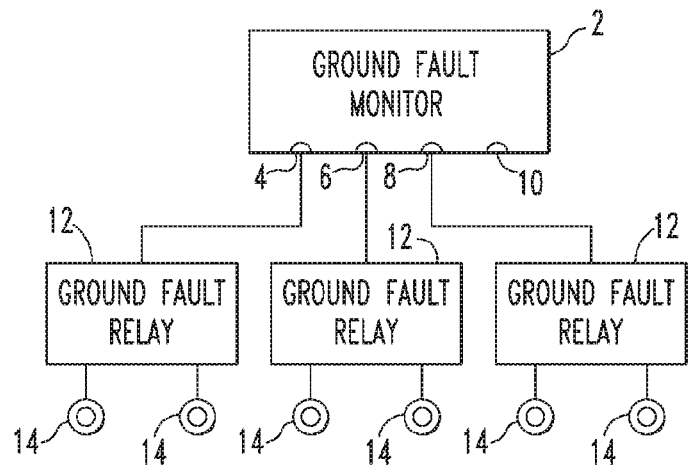
FIG. 1 is a block diagram of a prior ground fault monitoring system.

Directional phrases used herein, such as, for example, left, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the term "processor" shall mean a programmable analog and/or digital device that can store, retrieve, and process data (e.g., without limitation, a computer; a workstation; a personal computer; a controller; a digital signal processor; a microprocessor; a microcontroller; a microcomputer; a central processing unit; a mainframe computer; a mini-computer; a server; a networked processor; a programmable logic controller; or any suitable processing device or apparatus).

Figure 2:
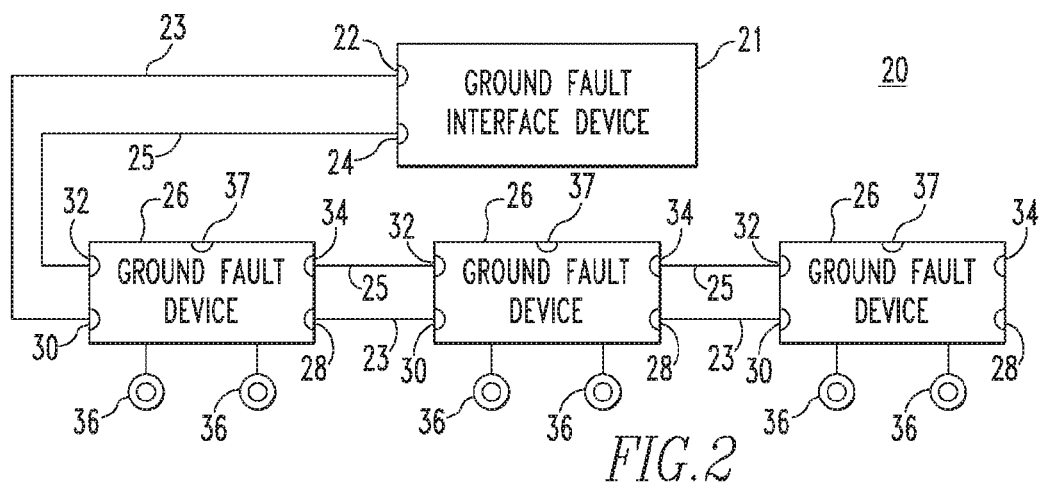
FIG. 2 is a block diagram of a ground fault monitoring system in accordance with an example embodiment of the disclosed concept.

FIG. 2 is a block diagram of a ground fault monitoring system 20 in accordance with an example embodiment of the disclosed concept. The ground fault monitoring system 20 includes a ground fault interface device 21 and three ground fault devices 26. While three ground fault devices 26 are disclosed in the example embodiment of the disclosed concept shown in FIG. 2, it will be appreciated by those having ordinary skill in the art that any number of ground fault devices 26 may be employed in the ground fault monitoring system 20 without departing from the scope of the disclosed concept.

The ground fault interface device 21 includes a data interface 22 and a power interface 24. The data interface 22 is structured to connect to a data line 23 (e.g., without limitation, a cable suitable to carry a data transmission). The ground fault interface device 21 is configured to receive data from the ground fault devices 26 via the data interface 22. The data interface 22 may be, without limitation, a connector, a terminal, a port, or any other suitable interface to electrically connect the data line 23 with the ground fault interface device 21.

The power interface 24 is structured to connect to a power line 25 (e.g., without limitation, a cable suitable to carry a power transmission). The ground fault interface device 24 is structured to output power to the ground fault devices 26 via the power interface 24. The power interface 24 may be, without limitation, a connector, a terminal, a port, or any other suitable interface to electrically connect the power line 25 with the ground fault interface device 21.

The ground fault devices 26 are structured to detect ground faults on circuits (not shown) associated with the ground fault devices 26. The ground fault devices 26 are also structured to output data of detected ground faults to the ground fault interface device 21 via the data lines 23. The ground fault devices 26 are also structured to receive power to operate themselves via the power lines 25.

The ground fault devices 26 are electrically connected in a series connection with the ground fault interface device 21 by the data lines 23 and the power lines 25.

The ground fault devices 26 each include a data input interface 28 and a data output interface 30. The data input and output interfaces 28,30 are structured to allow data lines 23 to be connected to the ground fault device 26. The ground fault devices 26 are configured to output data to the ground fault interface device 21 or another ground fault device 26 via the data output interface 30 and the data lines 23. The ground fault devices 26 are also configured to receive data from another ground fault device 26 via the data input interface 28. The ground fault devices 26 are further configured to pass through data received via the data lines 23 at the data input interface 28, and to output the received data at the data output interface 30. Thus, if the ground fault device 26 is not the first in the series connection of ground fault devices 26, the data will be passed through to the previous ground fault device 26 in the series connection. Thus, the data output by one of the ground fault devices 26 will continue to be passed through each ground fault device 26 in the series connection unit it reaches the first ground fault device 26 in the series connection which will pass through the data to the ground fault interface device 21.

The ground fault devices 26 may use any suitable communication protocol to communicate with the ground fault interface device 21. In some example embodiments of the disclosed concept, the ground fault devices 26 use, without limitation, an EtherNet Internet Protocol (IP) or Modbus Transmission Control Protocol (TCP) communication protocol to communicate with the ground fault interface device 21.

The ground fault devices 26 each also include a power input interface 32 and a power output interface 34. The power input and output interfaces 32,34 are structured to allow the ground fault devices 26 to be connected to power lines 25. The ground fault devices 26 are structured receive power from the ground fault interface device 21 via the power input interface 32. The ground fault devices 26 are configured to use the power received via the power input interface 32 to power their own operations. The ground fault devices 26 are also structured to pass through power received at the power input interface 32 and output it to the next ground fault device 26 in the series connection via the power output interface 34. In this manner, power output via the power interface 24 of the ground fault interface device 21 will be passed along through all of the ground fault devices 26 and thus can be used to power operation of all of the ground fault devices 26.

In the example embodiment of the disclosed concept shown in FIG. 2, three ground fault devices 26 are shown. However, additional ground fault devices 26 may be added to the ground fault monitoring system by connecting the data output interface 30 and the power input interface 32 of the additional ground fault device 26 to the data input interface 28 and the power output interface 34 of the last ground fault device 26 in the chain of ground fault devices 26. Expanding the number of ground fault devices 26 used in the ground fault monitoring system 20 does not necessitate any additional data or power interfaces 22,24 in the ground fault interface device 21 since both power and data are passed through the ground fault devices 21. Thus, the number of ground fault devices 26 that may be employed in the ground fault monitoring system 20 is not constrained by the number of data and power interfaces 22,24 in the ground fault interface device 21. As such, it will be appreciated by those having ordinary skill in the art that any number of ground fault devices 26 may be employed in the ground fault monitoring system 20 without departing from the scope of the disclosed concept.

The ground fault devices 26 are each configured to electrically connect to pair of current transformers 36. The current transformers 36 are then be used to sense current flowing through the circuits (not shown) associated with the ground fault device 26. The ground fault devices 26 are configured to detect ground faults in the circuits based on the inputs of the current transformers 36. The ground fault devices 26 are also configured to transmit data of the ground faults to the ground fault interface device 21, either directly or through another ground fault device 26, via the data output interface 30. The data of the ground faults may then be accessed by a user of the ground fault monitoring system 20 at the ground fault interface device 21.

In some example embodiments of the disclosed concept, the ground fault devices 26 are configured to output data on detected ground fault currents to the ground fault interface device 21 via the data lines 23. The ground fault interface devices 26 may be configured to output a signal to the ground fault interface device 21 that is proportional to the amount of ground fault current sensed by the ground fault device 26.

The ground fault devices 26 include a trip output interface 37. In some example embodiments of the disclosed concept, the trip output interface 37 is configured to output a trip signal to an associated circuit breaker (not shown) to cause the circuit breaker to trip. The ground fault devices 26 may be configured to automatically output the trip signal when a ground fault current above a predetermined level is detected. The ground fault interface device 21 may also control the ground fault devices 26 to output the trip signal. In some other example embodiments of the disclosed concept, the trip output interface 37 is configured to output an alarm signal.

In some example embodiments of the disclosed concept, the ground fault devices 26 are addressed so that the ground fault interface device 21 can recognize which ground fault device 26 it is receiving a signal from. The ground fault devices 26 may use any suitable addressing scheme. In some example embodiments of the disclosed concept, the ground fault devices 26 are addressed through the use of static IP addresses.

In some example embodiments of the disclosed concept, the ground fault interface device 21 is configured to receive data on detected ground fault currents from the ground fault interface devices 26. The ground fault interface device 21 is also configured to sum the ground fault currents detected by a group of the ground fault interface devices 26 (e.g., without limitation, the ground fault interface devices 26 corresponding to a defined zone) and to control the group of ground fault devices 26 to output trip signals when the sum of the ground fault currents exceeds a predetermined value.

It is contemplated that the ground fault devices 26 and/or the ground fault interface device 21 may include a processor (not shown). The processor may be, for example and without limitation, a microprocessor, a microcontroller, or some other suitable processing device or circuitry, that interfaces with the memory. It is also contemplated that ground fault devices 26 and/or the ground fault interface device 21 may include a memory (not shown). The memory may be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. It is contemplated that the processor and/or memory may be employed to implement one or more operations of the ground fault devices 26 and/or the ground fault interface device 21 such as, without limitation, gathering data, transmitting data, analyzing data, and displaying data.

In some example embodiments of the disclosed concept, the ground fault interface device 21 is configured to output signals such as, without limitation, data of ground faults on the circuits, to other devices such as, without limitation, shunt trip units or alarms.

Figure 3:
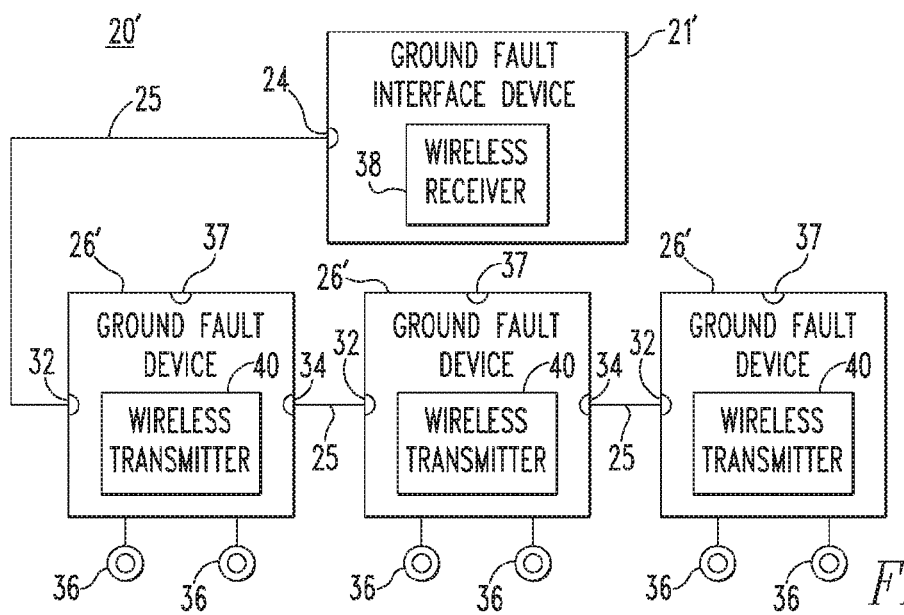
FIG. 3 is a block diagram of a ground fault monitoring system in accordance with another example embodiment of the disclosed concept.

FIG. 3 is a block diagram of a ground fault monitoring system 20' in accordance with another example embodiment of the disclosed concept. The ground fault monitoring system 20' of FIG. 3 is similar to the ground fault monitoring system 20 of FIG. 2. However, the ground fault monitoring system 20' of FIG. 3 includes a ground fault interface device 21 including a wireless receiver 38 and ground fault devices 26' each including a wireless transmitter 40.

The wireless transmitters 40 are configured to transmit data of ground faults to the wireless receiver 38. The wireless receiver 38 and wireless transmitters 40 may communicate using any suitable wireless communication protocol. Furthermore, it is contemplated that the wireless receiver 38 and wireless transmitters 40 may use any type of wireless communication (e.g., without limitation, radio, optical, sonic, etc.) without departing from the scope of the disclosed concept.

The wireless transmission of data between the ground fault devices 26' and the ground fault interface device 21', the data interface 24, data lines 25, data input interface 28, and data output interface 30 (see FIG. 2) may be omitted from the ground fault monitoring system 20' of FIG. 3 while still allowing any number of ground fault devices 26' to be added to the ground fault monitoring system 20'.

Figure 4:
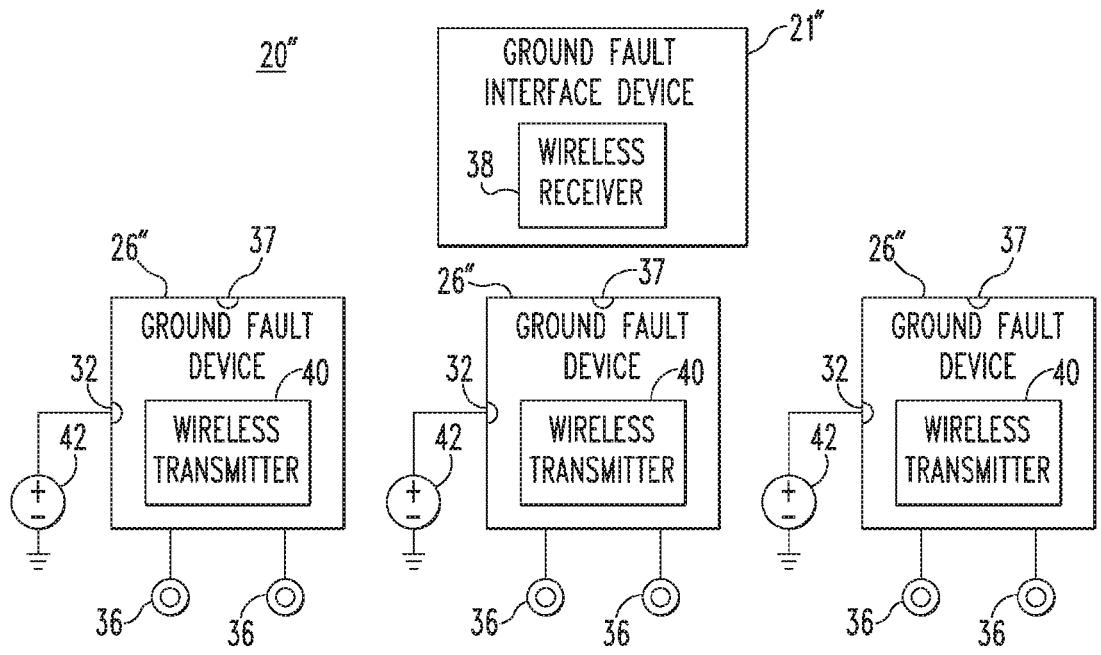
FIG. 4 is a block diagram of a ground fault monitoring system in accordance with another example embodiment of the disclosed concept.

FIG. 4 is a block diagram of a ground fault monitoring system 20" in accordance with another example embodiment of the disclosed concept. The ground fault monitoring system 20" of FIG. 4 is similar to the ground fault monitoring system 20' of FIG. 3. However, in the ground fault monitoring system 20" of FIG. 4, the power input interfaces 32 of the ground fault monitoring devices 26" are electrically connected to power sources 42.

The power sources 42 may be utility power or any other power source suitable to provide power to operate the ground fault devices 26". Thus, the ground fault devices 26" may be electrically connected to power sources 42 in their vicinity, rather than to each other.

In this example embodiment of the disclosed concept, the wireless transmitters 40 in the ground fault devices 26" and the wireless receiver 38 in the ground fault interface device 21" allow the ground fault devices 26" to wirelessly communicated data to the ground fault interface device 21". Furthermore, the ground fault devices 26" may receive power from the power sources 42 directly, rather than via the ground fault interface device 21" or other ground fault devices 26". As such, in this example embodiment of the disclosed concept, wiring between the ground fault interface device 21" and the ground fault devices 26" or between one of the ground fault devices 26" and another of the ground fault devices 26" is not needed.

Figure 5:
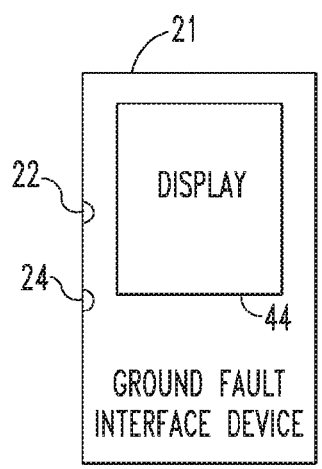
FIG. 5 is a block diagram of a ground fault interface device in accordance with an example embodiment of the disclosed concept.

FIG. 5 is a block diagram of the ground fault interface device 21 of FIG. 2. As shown in FIG. 5, the ground fault interface device 21 may include a display 44. The display 44 may be any suitable type of display such as, without limitation, a liquid crystal display (LCD) or a light emitting diode (LED) display. The display 44 is configured to display the data received from the ground fault devices 26 (see FIG. 2) so that the user of the ground fault monitoring system 20 can determine whether there are any ground faults on the monitored circuits. The display 44 may also be a touch screen type display that is able to receive inputs from the user of the ground fault monitoring system 20.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A ground fault monitoring system comprising:
   a plurality of power lines;
   a ground fault interface device including a power interface structured to connect to one of the power lines and a wireless receiver structured to receive wirelessly transmitted data, wherein the ground fault interface device is structured to output power via the power interface; and
   a plurality of ground fault devices structured to detect a ground fault on an associated circuit and to receive power to operate the ground fault devices via the power lines,
   wherein each of the plurality of ground fault devices includes a wireless transmitter structured to output the data of the detected ground fault to the wireless transmitter included in the ground fault interface device,
   wherein the plurality of ground fault devices are electrically connected in a series connection with the ground fault interface device by the plurality of power lines,
   wherein each of the plurality of ground fault devices is configured to pass through power received via the power lines to a next one of the plurality of ground fault devices in the series connection, and
   wherein the associated circuit does not include one or more of the plurality of power lines.

2. The ground fault monitoring system of claim 1, wherein each of the ground fault devices includes:
   a power input interface structured to connect to one of the power lines and to receive power; and
   a power output interface structured to connect to one of the power lines and to output power,
   wherein the ground fault device is configured to pass through power received at the power input interface and to output said power at the power output interface.

3. The ground fault monitoring system of claim 1, further comprising:
   a plurality of current sensors,
   wherein each of the ground fault devices is electrically connected to a corresponding two of the current sensors, and
   wherein the ground fault devices are structured to detect ground faults on the associated circuits based on outputs of the current sensors.

4. The ground fault monitoring system of claim 1, wherein the data of the detected ground fault includes a ground fault current level on the associated circuit.

5. The ground fault monitoring system of claim 1, wherein the ground fault interface device includes a display structured to display data received from the ground fault devices.

6. The ground fault monitoring system of claim 1, wherein each of the ground fault devices includes a trip output interface; and wherein each of the ground fault devices is configured to output a trip signal to an associated circuit breaker via the trip output interface.

7. The ground fault monitoring system of claim 1, wherein the plurality of ground fault devices includes at least three ground fault devices.

* * * * *